United States Patent
Cornelissen et al.

(10) Patent No.: US 9,470,380 B2
(45) Date of Patent: Oct. 18, 2016

(54) LIGHTING DEVICE WITH ELECTROSTATICALLY ADHERED SCATTERING PARTICLES AND METHOD OF MANUFACTURE

(75) Inventors: Hugo Johan Cornelissen, Waalre (NL); Martinus Hermanus Wilhelmus Maria Van Delden, Venlo (NL); Hendrikus Hubertus Petrus Gommans, Eindhoven (NL); Leon Wilhelmus Godefridus Stofmeel, Eindhoven (NL); Giovanni Cennini, Eindhoven (NL); Jianghong Yu, Best (NL)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 136 days.

(21) Appl. No.: 14/122,288

(22) PCT Filed: Jun. 5, 2012

(86) PCT No.: PCT/IB2012/052821
§ 371 (c)(1),
(2), (4) Date: Nov. 26, 2013

(87) PCT Pub. No.: WO2012/168858
PCT Pub. Date: Dec. 13, 2012

(65) Prior Publication Data
US 2014/0160752 A1    Jun. 12, 2014

(30) Foreign Application Priority Data
Jun. 10, 2011    (EP) .................................. 11169455

(51) Int. Cl.
*F21V 11/00*    (2015.01)
*F21K 99/00*    (2016.01)
(Continued)

(52) U.S. Cl.
CPC . *F21K 9/58* (2013.01); *F21K 9/90* (2013.01); *H01L 25/0753* (2013.01); *H01L 33/508* (2013.01); *H01L 2224/45147* (2013.01); *H01L 2924/00014* (2013.01); *H01L 2933/0041* (2013.01); *H01L 2933/0091* (2013.01)

(58) Field of Classification Search
CPC ............. F21Y 2105/001; F21V 5/002; H01L 21/02697; F21K 9/50; F21K 9/90
See application file for complete search history.

(56) References Cited

U.S. PATENT DOCUMENTS 6,747,406 B1    6/2004  Bortscheller
7,101,061 B2 *  9/2006  Nagai ...................... F21K 9/00
                                                  257/E25.02

(Continued)

FOREIGN PATENT DOCUMENTS

CN    1713407 A    12/2005
CN    1813499 A    8/2006
(Continued)

*Primary Examiner* — Ismael Negron

(57) ABSTRACT

A lighting device has an array of light emitting diodes (LEDs), an adhesion layer having portions with photo-activated electrical conductivity over the LEDs, and electrically charged scattering particles adhered by electrostatic attraction to the adhesion layer portions, thereby forming scattering regions that are self-aligned to the light emitting diodes. A method for manufacturing the lighting device includes photo-activating the adhesion layer using light output from the light emitting diodes to locally vary the conductivity of the adhesion layer; and attaching electrically charged scattering particles to the adhesion layer by electrostatic attraction.

7 Claims, 2 Drawing Sheets

(51) Int. Cl.
*H01L 25/075* (2006.01)
*H01L 33/50* (2010.01)

(56) References Cited

U.S. PATENT DOCUMENTS

| | | | | |
|---|---|---|---|---|
| 7,217,956 | B2* | 5/2007 | Daniels | F21K 9/00 |
| | | | | 257/88 |
| 7,862,192 | B2* | 1/2011 | Chang | F21V 5/00 |
| | | | | 362/244 |
| 8,162,506 | B2* | 4/2012 | Wei | F21V 9/10 |
| | | | | 257/98 |
| 8,343,571 | B2* | 1/2013 | Werners | B32B 17/10036 |
| | | | | 313/498 |
| 8,669,699 | B2* | 3/2014 | Daicho | F21V 9/16 |
| | | | | 313/498 |
| 8,672,497 | B2* | 3/2014 | Park | F21K 9/56 |
| | | | | 362/293 |
| 2005/0212007 | A1 | 9/2005 | Daniels et al. | |
| 2005/0279996 | A1* | 12/2005 | Takubo | H01L 51/0003 |
| | | | | 257/40 |
| 2010/0090245 | A1* | 4/2010 | Lin | H01L 33/483 |
| | | | | 257/100 |
| 2010/0254127 | A1* | 10/2010 | Yang | F21V 3/00 |
| | | | | 362/231 |
| 2010/0301728 | A1* | 12/2010 | Helbing | F21V 3/00 |
| | | | | 313/46 |
| 2011/0211345 | A1* | 9/2011 | De Boer | G02F 1/133603 |
| | | | | 362/235 |
| 2012/0153311 | A1* | 6/2012 | Yuan | F21K 9/90 |
| | | | | 257/88 |

FOREIGN PATENT DOCUMENTS

| | | |
|---|---|---|
| CN | 101088140 A | 12/2007 |
| CN | 101790700 A | 7/2010 |
| JP | 7304210 A | 11/1995 |
| JP | 11046019 A | 2/1999 |
| JP | 2006310042 A | 11/2006 |
| JP | 200751321 A | 11/2007 |
| TW | 201015697 A | 4/2010 |
| WO | 2009096057 A1 | 8/2009 |

* cited by examiner

LIGHTING DEVICE WITH ELECTROSTATICALLY ADHERED SCATTERING PARTICLES AND METHOD OF MANUFACTURE

DESCRIPTION OF THE INVENTION

This invention relates to light output devices, particularly but not exclusively using discrete light sources associated with a transparent substrate structure. The invention also relates to a method of manufacturing such devices.

BACKGROUND OF THE INVENTION

One known example of this type of lighting device is a so-called "LED in glass" device. An example is shown in FIG. 1. Typically a glass plate is used, with a transparent conductive coating (for example ITO) forming electrodes. The conductive coating is patterned in order to make the electrodes that are connected to a semiconductor LED device. The assembly is completed by laminating the glass, with the LEDs 4 inside a thermoplastic layer (for example polyvinyl butyral, PVB) or an organic resin layer.

FIG. 2 shows the known LED in glass structure in cross section. The device comprises glass plates 1 and 2. Between the glass plates are (semi-) transparent electrodes 3a and 3b (for example formed using ITO or thin electrically conductive wires), and an LED 4 connected to the transparent electrodes 3a and 3b. A layer of insulating material 5 is provided between glass plates 1 and 2 (conventionally PVB or UV resin).

Applications of this type of device are shelves, showcases, facades, office partitions, wall cladding, and decorative lighting. The lighting device can be used for illumination of other objects, for display of an image, or simply for decorative purposes.

Top emitting LEDs can be used, and these have a spot light source output. Side emitting LEDs can also be used, the light output then being coupled to the output from scattering centers in the resin.

To make the spot output more uniform, it is known to apply a reflector or other light shield over the LED, to act as a mask for reducing the local light output intensity. This adds complexity to the manufacture of the device so that there remain difficulties in providing a desired output from the discrete light sources, in terms of illumination direction and illumination spot size, and in a way which does not significantly increase the manufacturing cost.

There is also a desire to create luminescent sheets, preferably thin, with significant flexibility. This enables a wider variety of uses for the product and can also save on expensive moulding procedures in the manufacturing process. An optically transparent material is required with flexibility at the desired thickness of around 1-10 mm.

One example is to place LEDs within a wire grid that is embedded in silicone. This design replaces costly Printed Circuit Boards PCBs or glass substrate arrangements. The wire grid, however, does not allow for a small tolerance in the alignment of the LED devices, by virtue of its non-rigid nature.

In order to mask the LED hot spots for LEDs formed in such a grid structure, optical structures can be provided over the LED grid as mentioned above. However, the available tolerance for positioning the required optical structures is low, for example around 1 mm or worse. The required optical structures that are used to mask the hot spots require a level of alignment in the range 10-100 micrometers with respect to the LED position. Thus, the accurate alignment of optical structures over the LEDs presents problems.

SUMMARY OF THE INVENTION

According to the invention, there is provided a light output device comprising:
an array of electrically interconnected light emitting diodes;
a substrate layer within which or on which the light emitting diode array is positioned;
an adhesion layer having portions over the light emitting diodes, wherein the adhesion layer has a photo-activated property; and
scattering particles adhered to the adhesion layer portions.

The invention makes use of scattering particles which are positioned over the LEDs, for example to form diffusely reflective caps. Accurate alignment of these reflective caps with the LED contained in the LED grid is required, particularly if the LED grid may be stretched or deformed to a certain extent. This results in an LED placement that is somewhat unpredictable. The invention makes use of a photo-sensitive process which is used to deposit a scattering (and therefore at least partially reflective) structure above each LED. This enables self alignment with the LEDs using the LEDs to provide the photo-activation.

The invention can be applied to a structure with a rigid substrate layer which carries the wire grid. However, the invention is of particular interest when the substrate layer is flexible. In this case, movement of the substrate layer as well the accuracy of the wire grid shape cause issues when aligning the reflector portions over the LEDs, and these issues are addressed by the invention. It is observed that within the scope of the present invention, the array of LEDs can be positioned on a main surface of the substrate layer. However, positioning of the array of LEDs within the substrate layer is preferred by far. Latter embodiment of the invention is especially suitable for embedded LED grids.

It is further noted that the adhesion layer will preferably be a discontinuous layer. Such discontinuous layer does not cover the whole substrate layer, but at least covers the layer portions which are positioned over the LEDs. It is also stressed that the array of LEDs may be designed one-dimensional, resulting in light output devices which are shaped as light-lines. However, light output devices in which the array of LEDs is shaped as a two-dimensional plane are preferred. Such devices have the form of a light-sheet.

In one example, the LED light can be used to sensitize/activate a photo-sensitive adhesive. Subsequently, scattering particles such as $TiO_2$ crystallites or phosphor crystallites can be adhered to the surface. This provides an approach which enables reflectors to be fabricated on top of the LEDs that is based on self-alignment. The light of the LED itself is used to control the deposition process.

In this example, the adhesion layer is based on photo-activated adhesion. However, in another, less preferred example, the adhesion layer is based on photo-activated electrical conductivity.

The encapsulation layer can comprise silicone and the scattering particles can comprise $TiO_2$ particles.

The invention also provides a method of manufacturing a light output device, comprising:
embedding an array of electrically interconnected light emitting diodes into an encapsulation layer;
providing an adhesion layer over the light emitting diodes;

photo-activating the adhesion layer using light output from the light emitting diodes; and applying scattering particles to the adhesion layer.

BRIEF DESCRIPTION OF THE DRAWINGS

Examples of the invention will now be described in detail with reference to the accompanying drawings, in which.

The same reference numerals are used to denote similar parts throughout the Figures.

DETAILED DESCRIPTION OF EMBODIMENTS

The invention provides a light output device in which scattering regions (for example forming reflectors) are fabricated on top of the LEDs using a self-aligned process, during which the light of the LED itself is used to control the deposition process of the scattering particles.

Figure 1:
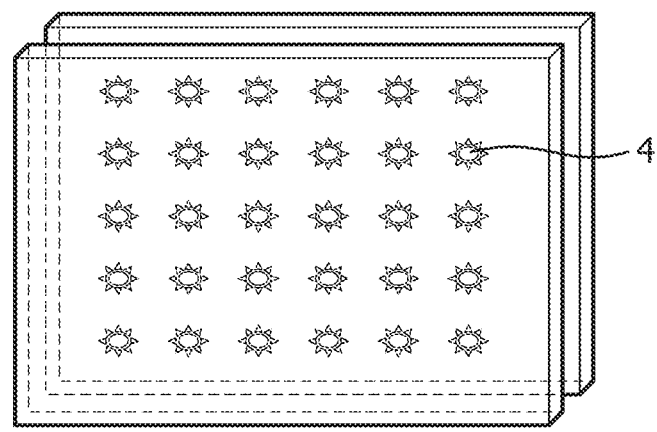
FIG. 1 schematically shows a known LED in glass illumination device.
Figure 2:
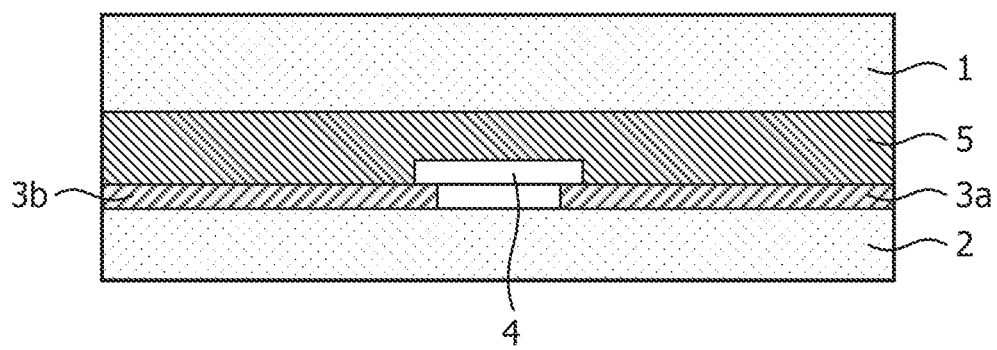
FIG. 2 schematically shows the structure of the device of FIG. 1 in cross section.
Figure 3:
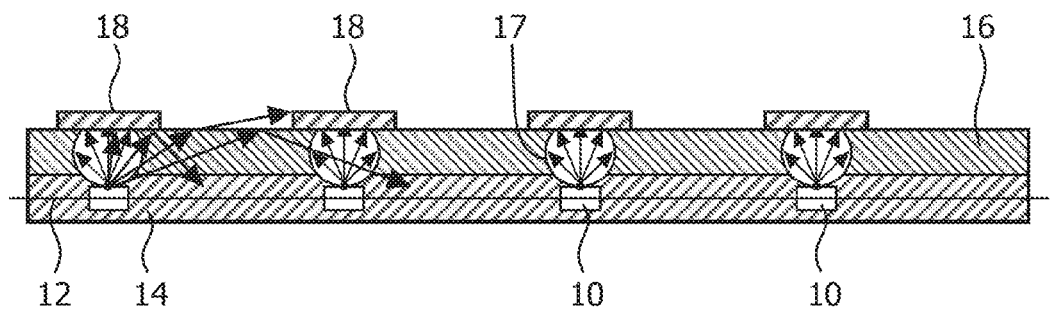
FIG. 3 shows a desired arrangement of reflectors to reduce hotspots not according to the present invention.

FIG. 3 shows the desired optical structure on top of a regularly spaced LED assembly on a wire grid.

The LED assembly comprises LEDs 10 and a wire grid 12 embedded in a transparent flexible substrate layer, here used as an encapsulation layer 14. This layer may be silicone, but other materials may be used, such as PolyVinylChloride (PVC) or PolyUrethane (PU).

The thickness of the encapsulation layer 14 is typically around 1 to 10 mm.

The wire grid can comprise electrically conductive wires that can deliver the required electrical current to the LEDs, e.g. copper wires of diameter 0.25 mm.

The wire grid and connected LEDs are formed by an industry-standard pick-and-place assembly and soldering process and the encapsulation is formed by casting or coating.

The LEDs are typically discrete off the shelf components, and have a typical size of 2×3 mm and a height of 0.5-1 mm and are spaced by 10 to 50 mm, depending on the requirements of the application.

The light output from each LED is shown as an envelope 17, and the maximum intensity is directed normally to the plane of the device. A light guide layer 16 is shown over the LEDs 10, but this is optional. When a light guide layer is used, this can be formed from transparent polymers such as PolyMethylMethAcrylate (PMMA), PolyCarbonate (PC), PolyStyrene (PS), PolyUrethane (PU) and PolySiloxane (silicone). The light guide layer can be mounted to the encapsulation layer by casting, coating or lamination.

The purpose of the light guide layer is to create an optical cavity from which light escapes more uniformly.

There is light extraction from the cavity, and this can be achieved by scattering in the encapsulation layer 14 and/or in the light guide layer 16, or by having optical surface structures on the light guide layer 16.

Reflectors 18 are provided over each LED 10 to block the normally directed bright intensity light spot, so that the device has a more uniform light intensity across its output surface. The reflectors are for example formed from $TiO_2$. They may be only partially reflective so that they reduce rather than block the light intensity.

A problem in forming the reflectors is that the LED positions are not perfectly regular, but accurate alignment is needed to position the reflectors 18 on top of the LEDs 10.

Figure 4:
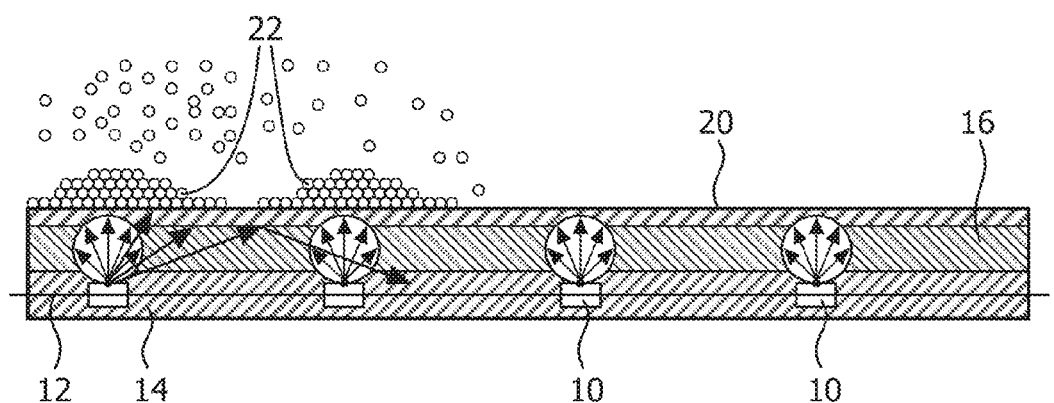
FIG. 4 shows a light output device of the invention.

FIG. 4 shows the device of the invention and also shows how the manufacturing takes place.

The structure of FIG. 3 (but without the idealized reflectors shown as 18) is provided with a photo-sensitive layer 20, for example a blue light photo-activated adhesive such as a mono-acrylate or di-acrylate or epoxy, with a photo-initiator added. Alternatively, a daylight curable photo-resin can be used, commercially available for example from the companies Henkel and Norland.

For example, the light curable adhesives from the Henkel Corporation of Connecticut, USA, named LOCTITE 3100, 3101, 3102 or 3103 can be used, or optical adhesives from Norland Products of New Jersey, USA, that are referred to as NOA72, NOA75 or NOA76 can be used.

The advantage of using blue light emitting diodes instead of UV-emitting diodes is that many materials that do not allow for the transmission of UV light do allow for the transmission of blue light. For instance, if the light guide layer 16 were made from PMMA or PC it would not pass UV-light.

During manufacturing of the device, the photo-sensitive adhesive layer 20 is applied to the unfinished encapsulated LEDs. The LEDs are switched on. The light of the LEDs locally activates the adhesive layer. Scattering particles 22 such as $TiO_2$ particles or phosphor crystallites are then provided to the surface of the structure, and they only attach to the activated areas.

Finally the residual layers are removed and the adhered scattering particles remain in place.

The scattering particles preferentially adhere to the surface where the light intensity is highest, directly above the LEDs. Between the LEDs, the deposited layer is thinner or absent because the adhesive is not activated. If necessary, the layer deposition process can be repeated multiple times. It is a self-regulating mechanism: as soon as the light intensity lowers due to back scattering from the particles that have become attached, the further deposition of scattering particles lowers.

The photo-initiators are added to the monomers of the adhesive in a limited concentration, e.g. 1-2% and they are used up by the polymerization process. They initiate the polymerization reaction and become an end-part of the polymer chains. Hence they cannot initiate the reaction a second time; new photo-initiator molecules are then needed. These are provided if the deposition process is repeated multiple times as described above. On top of the reflector formed from the scattering particles 22, a new layer is deposited, a new activation is started and a new reflector is formed in those regions where the LED light intensity is highest. Thus, the reflector area grows outwardly from the light spot areas to incrementally make the light output more uniform.

In this way, the adhesion process naturally tends towards a structure giving a uniform light intensity across the output surface area.

An alternative embodiment is to sensitize the light guide layer with a photo-conductive surface and use electric fields as the mechanism for attraction of particles to an activated area, in a similar manner to photocopying machines. A photo-conductive layer is coated on the light guide. The light of the LEDs locally changes the conductivity of the layer and charged $TiO_2$ particles are attracted to the surface. The $TiO_2$ particles can additionally have a UV-activated adhesive coating to permanently adhere them to the surface.

The invention is of particular interest for signage, decorative lighting such as lamps, windows, architectural glass, and secrecy windows, although other applications are possible, such as furniture and other decorative items.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light output device comprising:
   an array of electrically interconnected light emitting diodes;
   a substrate layer within which or on which the light emitting diode array is positioned;
   an adhesion layer having portions over the light emitting diodes, wherein the adhesion layer portions have a photo-activated electrical conductivity and
   electrically charged scattering particles adhered by electrostatic attraction to the adhesion layer portions, thereby forming scattering regions that are self-aligned to the light emitting diodes.

2. A device as claimed in claim 1, wherein the substrate layer is flexible.

3. A device as claimed in claim 2, wherein the substrate layer comprises silicone.

4. A device as claimed in claim 3, wherein the scattering particles comprise $TiO_2$ particles.

5. A device as claimed in claim 4, wherein a light guide layer is positioned between the substrate layer and the adhesion layer.

6. A method of manufacturing a light output device, comprising:
   positioning an array of electrically interconnected light emitting diodes into a substrate layer;
   providing an adhesion layer over the light emitting diodes;
   photo-activating the adhesion layer using light output from the light emitting diodes to locally vary the conductivity of the adhesion layer; and
   attaching electrically charged scattering particles to the adhesion layer by electrostatic attraction.

7. A method as claimed in claim 6, further comprising curing the scattering particles in their attracted positions.

* * * * *